United States Patent [19]

Kitamura et al.

[11] Patent Number: 4,811,073
[45] Date of Patent: Mar. 7, 1989

[54] GATE ARRAY ARRANGEMENT

[75] Inventors: Yuji Kitamura; Ichiro Nakatsukasa, both of Gifu, Japan

[73] Assignee: Sanyo Electric Co., Ltd., Osaka, Japan

[21] Appl. No.: 183,426

[22] Filed: Apr. 18, 1988

Related U.S. Application Data

[63] Continuation of Ser. No. 928,634, Nov. 6, 1986, abandoned, which is a continuation of Ser. No. 669,508, Nov. 8, 1984, abandoned.

[30] Foreign Application Priority Data

Nov. 8, 1983 [JP] Japan ................... 58-210274

[51] Int. Cl.[4] .............. H01L 27/10; H01L 27/15
[52] U.S. Cl. ................... 357/45; 357/68; 357/40; 357/71
[58] Field of Search ............ 357/45, 40, 41, 68, 357/71

[56] References Cited

U.S. PATENT DOCUMENTS

| 4,393,464 | 7/1983 | Knapp et al. ............. 357/45 X |
| 4,523,106 | 6/1985 | Tanizawa et al. .......... 357/45 X |
| 4,562,453 | 12/1985 | Noguchi et al. ........... 357/45 X |
| 4,568,961 | 2/1986 | Noto ..................... 357/68 X |

FOREIGN PATENT DOCUMENTS

| 0073641 | 3/1983 | European Pat. Off. ....... 357/45 |
| 58-87854 | 5/1983 | Japan .................. 357/45 M |

OTHER PUBLICATIONS

Nakaya, M. et al., "High-Speed MOS Gate Array", IEEE Trans. on Elec. Dev., Aug. 1980, pp. 1665-1670.

Primary Examiner—Andrew J. James
Assistant Examiner—Sara W. Crane
Attorney, Agent, or Firm—Armstrong, Nikaido Marmelstein & Kubovcik

[57] ABSTRACT

A gate array arrangement formed on a semiconductor chip includes a plurality of I/O cells aligned along the four sides of the chip and a plurality of basic cells aligned in a plurality of rows extending parallelly to each other. A ground bus line and a power bus line extend in a space between the I/O cells and basic cells. The lines from the I/O cells are connected to the bus lines, and lines from basic cells are connected to bus lines. In this manner, the power supply lines between the I/O cells and basic cells are connected indirectly through the bus line, thereby allowing the determination of pitch of the I/O cells and pitch of basic cells independently of each other.

12 Claims, 6 Drawing Sheets

GATE ARRAY ARRANGEMENT

This application is a continuation of application Ser. No. 928,634 filed Nov. 6, 1986 now abandoned, which is a continuation of application Ser. No. 669,508 filed Nov. 8, 1984, now abandoned.

BACKGROUND OF THE INVENTION

1. Field of the Invention

The present invention relates to a semiconductor gate array and, more particularly, to an arrangement of cells and interconnection structure among cells.

2. Description of the Prior Art

Generally, the gate array is defined on a rectangular LSI chip having I/O (input and output) cells aligned along the four peripheral sides of the chip and a certain number of basic cells aligned in a number of rows and in an area surrounded by I/O cells.

An example of a prior art gate array is shown in FIG. 1a. Basic cells 1, each serving as a transistor, diode or any other electronic element, are aligned side-by-side in a row 10, and there are a plurality of, such as eight as shown in FIG. 1a, rows aligned parallelly to each other with a predetermined space W (FIG. 1b) between adjacent rows 10. Provided around the basic cell rows and along the four sides of a rectangular semiconductor chip are I/O cells 2 each having a width M and includes a certain number of transistors. Each I/O cell 2 has a power source terminal PDD and a ground terminal PSS for the electric power supply to each active basic cell 1. From power terminal PDD and ground terminal PSS of each I/O cell 2, power line VDD and ground line VSS extend parallel with one another and cross the row of basic cells 1 longitudinally, as shown in FIG. 1b.

In the drawing, a circle dot indicates an electric contact at which the line VDD or VSS is connected to the basic cell. Generally, the semiconductor chip has a multi-layer structure, and therefore, the line VDD or VSS is formed at a level different from the level provided with the cells. Accordingly, the contacts indicated by the circle dots extend in the thickness direction of the semiconductor chip. For example, in FIG. 1b, basic cell 1a is connected to lines VDD and VSS through power contact D and ground contact S. Similarly, basic cells 1c, 1e and 1f are connected to lines VDD and VSS through contacts D and S. The electric connection among basic cells and I/O cells for the signal transmission is done by a number of parallel lines (not shown) extending in the space W and also in a space between the edge of rows and the I/O cells.

According to the prior art gate array, since lines VDD and VSS extend from terminals PDD and PSS straight and parallel with one another, and cross the corresponding basic cell row longitudinally, the pitch between the rows 10 is equal to the pitch of the I/O cells 2. Accordingly, when designing various types of gate arrays, the percentage of the dead space occupied in one chip becomes relatively high, as explained below.

For example, when the number of the rows is made greater than the number of I/O cells aligned perpendicular to the rows, i.e., vertically when viewed in FIG. 1a, the I/O cells can be aligned with no extra space therebetween, but there may be some extra space between the rows aligned in alignment with each vertically aligned I/O cells, such as in the case when the number of signal transmission lines to be extended between the rows is rather small.

On the other hand, when the number of rows is made less than the vertically aligned I/O cells and, at the same time, the space W is widened, as shown in FIG. 2, for the reason such as to incorporate a greater number of signal transmission lines in the space W or for other reasons, the pitch of the I/O cells is also widened, requiring an unnecessary extra space X between I/O cells.

Also, according to the prior art gate array, within the width M (upper portion of FIG. 1a) of one I/O cell aligned parallel to the basic cell rows, there are exactly N (N being an integer) basic cells, and in the example shown in FIG. 1a, there are three basic cells included within the width M.

In other words, according to the prior art gate array, there is a correlation between the pitch of I/O cells and the pitch of basic cell rows, and also a correlation between the pitch of I/O cells and the pitch of basic cells in the row. Such a correlation will restrict the designing of various different arrangements of gate arrays, such as a semi-custom type gate array. The semi-custom type is a ready made type having basic cells and I/O cells already aligned on a master chip, but no lines and no contacts are provided. Later, in accordance with the customer's request, the lines and contacts designed in a particular pattern are added to complete the logic circuit as required by the customer. To meet the wide use, the gate array of semi-custom type may have a long pitch between the rows for allowing a great number of transmission lines between the rows and, at the same time, a great number of I/O cells for the wide use. However, because of the correlation between the pitch of I/O cells and the pitch of basic cell rows or basic cells described above, it has been very difficult to minimize the size of the chip for the given number of cells.

SUMMARY OF THE INVENTION

The present invention has been developed with a view to substantially solving the above described disadvantages and has for its essential object to provide an improved arrangement of gate array which utilizes the semiconductor chip efficiently with small dead portions and, thereby enabling the reduction of size of the semiconductor chip.

In accomplishing these and other objects, a gate array arrangement according to the present invention comprises on a rectangular semiconductor chip, a plurality of I/O cells aligned along the four sides of the chip and a plurality of basic cells aligned in a plurality of rows extending parallel with one another. A ground bus line and a power bus line extend in a space between the I/O cells and basic cells. The lines from the I/O cells are connected to the bus lines, and lines from basic cells are connected to bus lines. In this manner, the power supply lines between the I/O cells and basic cells are connected indirectly through the bus line, thereby allowing the determination of pitch of the I/O cells and pitch of basic cells independently of each other.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 1b is an enlarged scale fragmentary view of a portion B indicated in FIG. 1a;

DESCRIPTION OF THE PREFERRED EMBODIMENTS

Figure 1A:
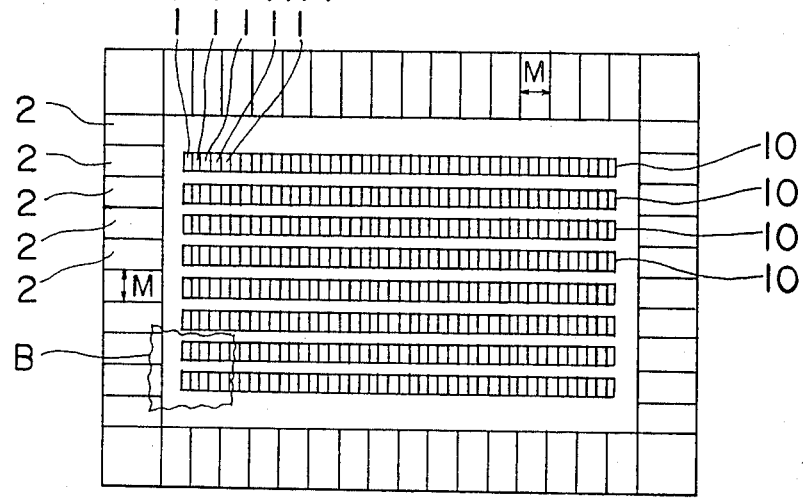
FIG. 1a is a top plan view of a gate array according to the prior art.
Figure 1B:
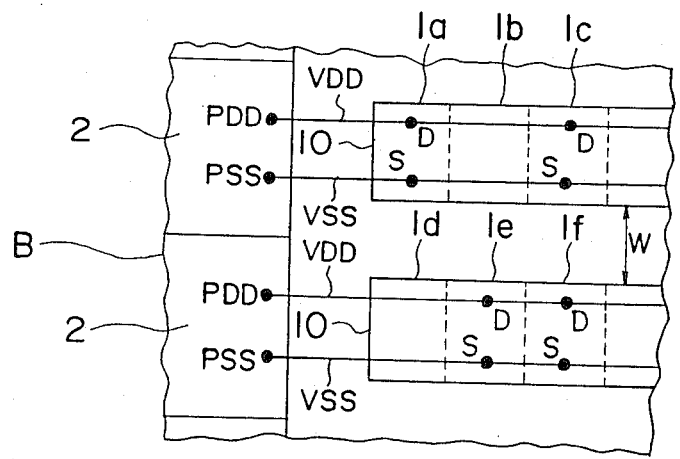
Figure 2:
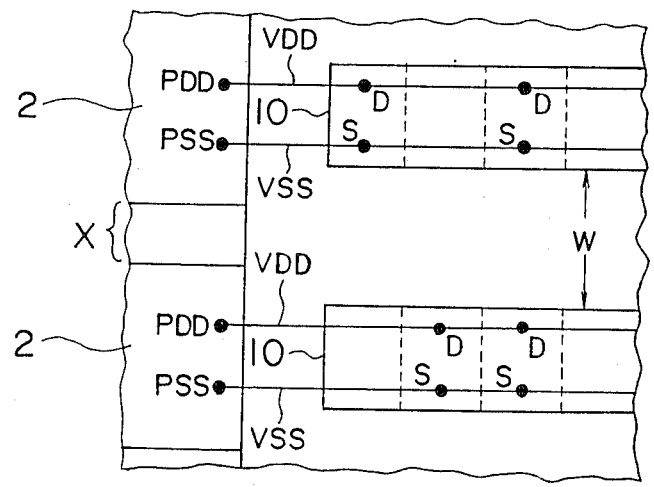
FIG. 2 is a view similar to FIG. 1b, but particularly showing modification thereof.
Figure 3:
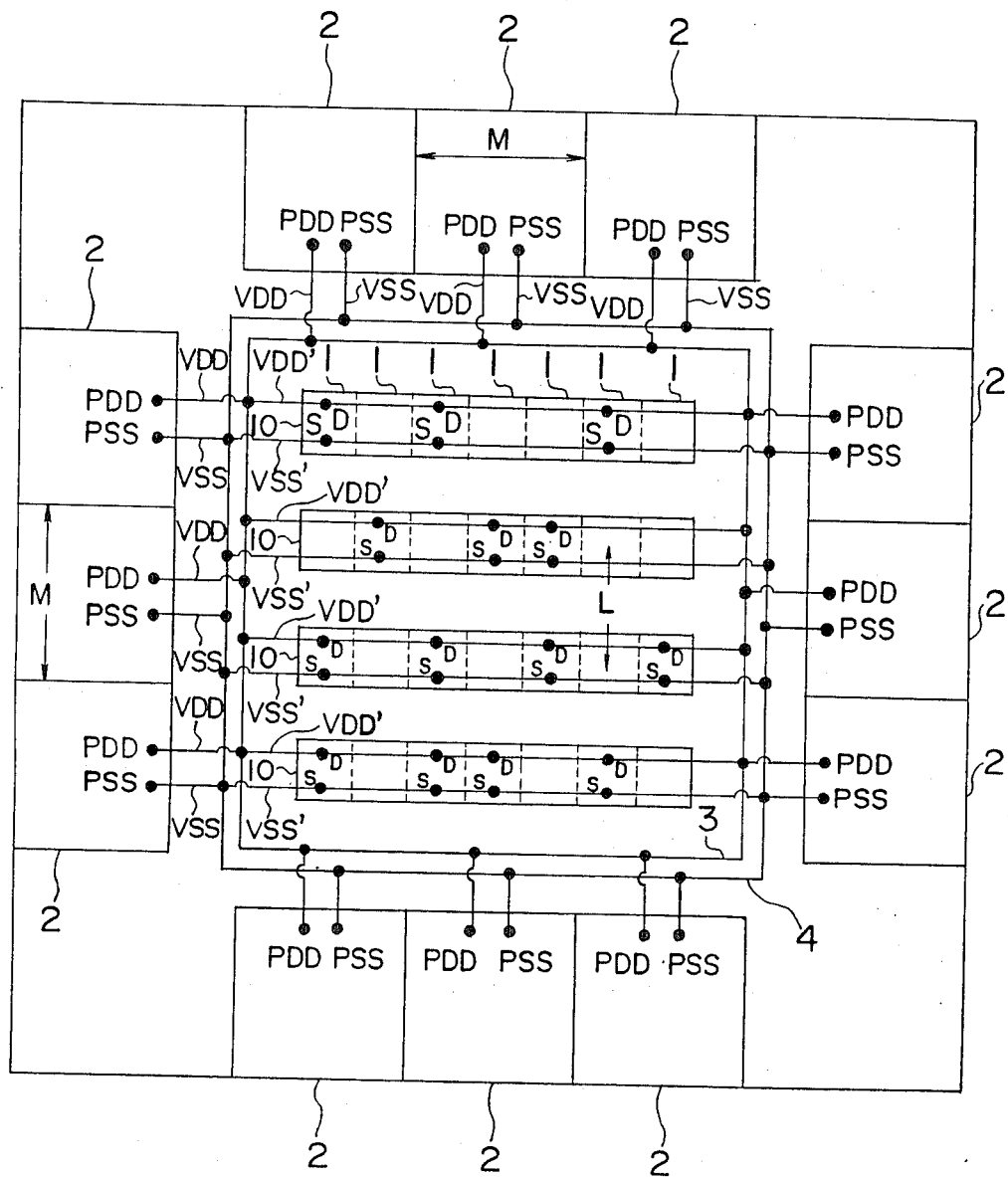
FIG. 3 is a top plan view of a gate array according to a first embodiment of the present invention.

Referring to FIG. 3, a first embodiment of a gate array according to the present invention is shown. The semiconductor chip shown has a rectangular configuration with four sides, which are two horizontal sides and two vertical sides, as viewed in FIG. 3. For the sake of brevity, the chip includes three I/O cells 2 aligned vertically in each of vertical sides and three I/O cells 2 aligned horizontally in each of horizontal sides. Since there is no extra space between adjacent I/O cells, the pitch of the aligned I/O cells 2 is substantially the same as the width of the I/O cell 2, i.e., M. Each I/O cell 2 has a certain number of transistors (not shown), power source terminal PDD and ground terminal PSS.

Within a space defined by I/O cells 2, there are shown four basic cell rows 10 aligned horizontally and parallel to each other with a predetermined pitch L. Each row including seven basic cells 1. Each basic cell 1 serves as a transistor, diode or any other electronic element. As apparent from FIG. 3, pitch M is greater than pitch L.

According to the present invention, the gate array further includes a pair of bus lines 3 and 4, extending in a space between I/O cells 2 and basic cells 1, and encircling basic cells 1 defining a closed loop of a rectangular shape.

A line VDD extends from power source terminal PDD in each I/O cell 2, and terminates at bus line 3 for the interconnection between line VDD and bus line 3. The interconnection is done by a contact, indicated by a circle dot. Accordingly, line VDD and bus line 3 serves as power supply lines. Similarly, a line VSS extends from ground terminal PSS in each I/O cell 2, and terminates at bus line 4 for the interconnection between line VSS and bus line 4. Accordingly, line VSS and bus line 4 serves as ground lines.

It is to be noted that lines VDD and VSS from the vertically aligned I/O cells 2 extend horizontally, and lines VDD and VSS from the horizontally aligned I/O cells 2 extend vertically.

In addition, there are two parallel lines VDD' and VSS' extending longitudinally across each basic cell row 10. The opposite ends of line VDD' are connected to power supply bus line 3 by contacts and the opposite ends of line VSS' are connected to ground bus line 4 by contacts. Lines VDD' and VSS' are connected to the desired basic cells through contacts D and S, as indicated in FIG. 3.

According to the first embodiment shown in FIG. 3, since lines VDD' and VSS' are connected to the nearest pair of lines VDD and VSS through bus lines 3 and 4, which extend vertically, the position of lines VDD' and VSS' can be changed vertically in accordance with the change of position of basic cell row 10. Thus, pitch L can be determined independently of pitch M. Also, pitch M can be determined independently of pitch L. Accordingly, any extra space between the vertically aligned I/O cells 2 and/or any extra space between the vertically aligned basic cell rows 10 can be simply eliminated.

In the first embodiment, a case when pitch L is smaller than pitch M is described. The present invention is also applicable to the case when pitch L is greater than pitch M, such as shown in FIG. 4.

Figure 4:
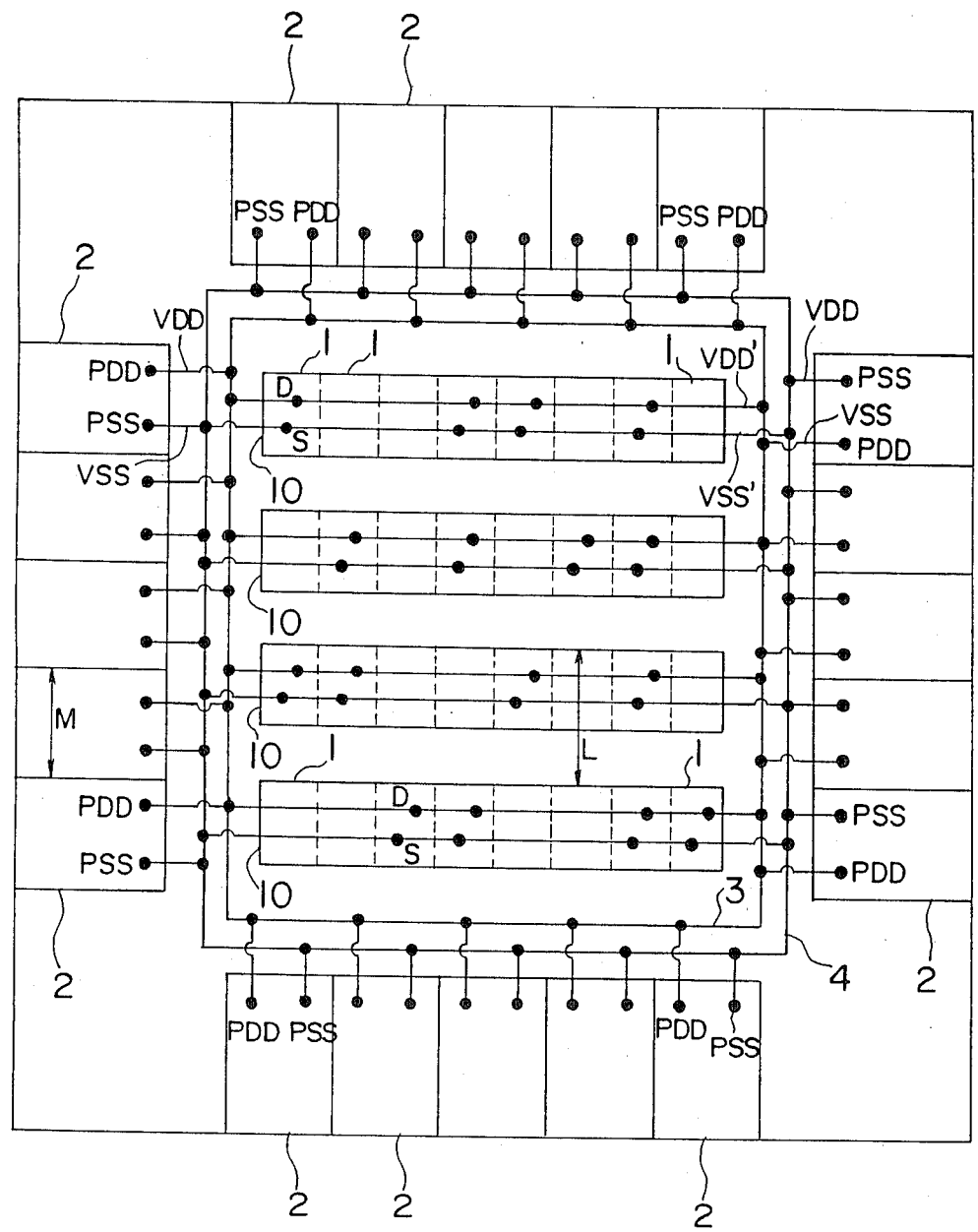
FIG. 4 is a top plan view of a gate array according to a second embodiment of the present invention.

Referring to FIG. 4, a second embodiment of a gate array according to the present invention is shown. When compared with the first embodiment, the second embodiment has five I/O cells 2 aligned in each of the vertical and horizontal sides of the rectangular chip. This arrangement results in such that pitch L is greater than pitch M.

Figure 5:
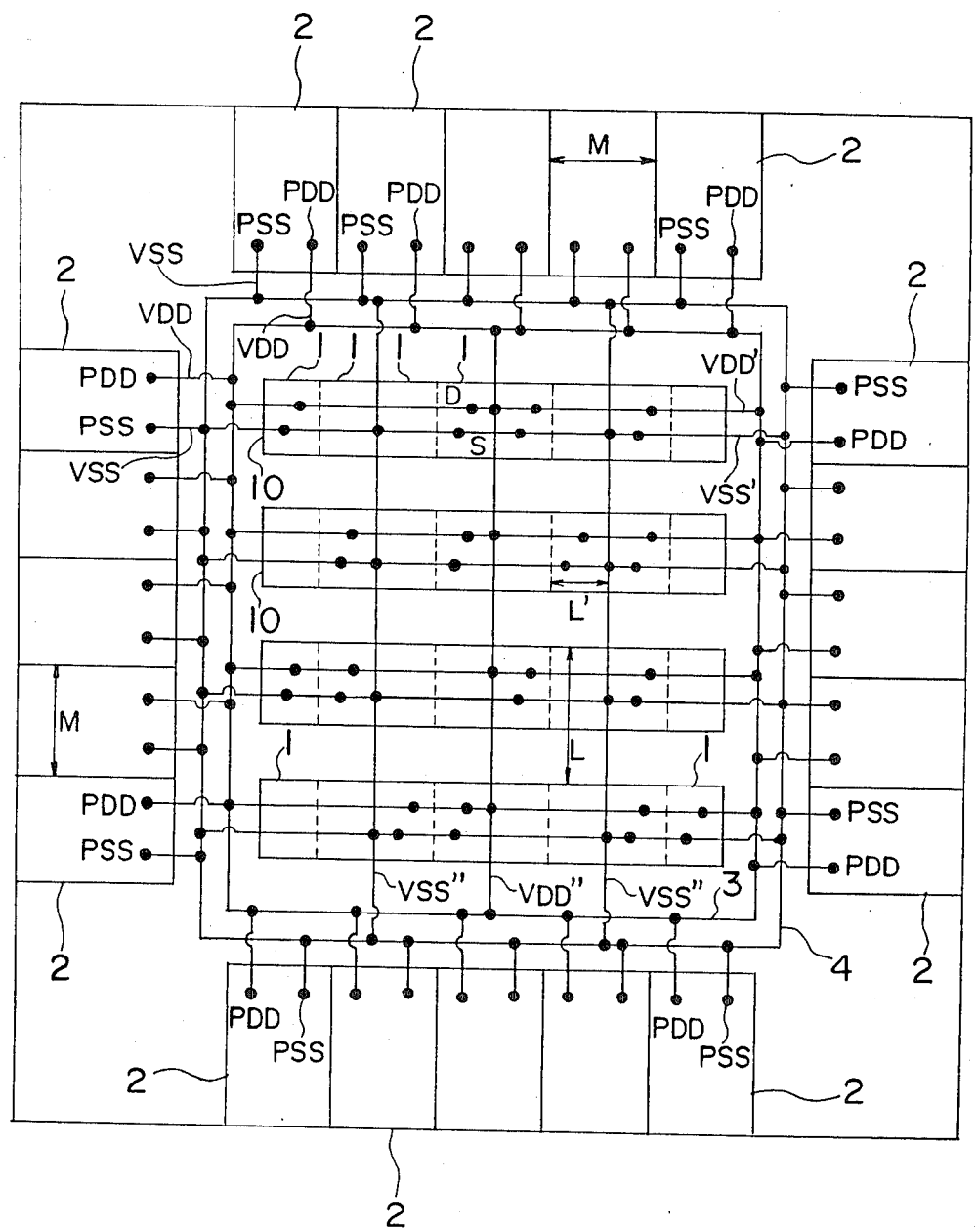
FIG. 5 is a top plan view of a gate array according to a third embodiment of the present invention.

Referring to FIG. 5, a third embodiment of a gate array according to the present invention is shown. In any of the above-described embodiments, bus lines 3 and 4 are connected with lines VDD' and VSS' extending horizontally for the connection to particular basic cells. According to the third embodiment, vertical lines VDD" and VSS" are further added for the connection to particular basic cells. Preferably, vertical lines VDD" and VSS" should extend at a boundary line between adjacent basic cells 1, and therefore, the places to extend vertical lines VDD" and VSS" are determined by the arrangement of basic cells 2. In the embodiment shown in FIG. 5, the number of basic cells 2 included in one row 10 is eight. Furthermore, the opposite ends of line VDD" should be connected to power source terminal PDD and line VDD which are off set with line VDD". According to the present invention, such an off set connection is accomplished by bus line 3. Similarly the off set connection between vertical line VSS" and terminal PSS through line VSS is accomplished by bus line 4. Accordingly, by the employment of bus lines 3 and 4 extending horizontally, vertical lines VDD" and VSS" can be located regardlessly of positions of terminals PSS and PDD. Thus, pitch L' of basic cells 1 aligned horizontally can be determined independently of pitch M of I/O cells 2. Therefore, when designing a gate array it is not necessary to incorporate an integer number of basic cells 1 to be exactly fitted in one width M or in a given number of widths nM (n is an integer equal to or greater than 2).

Figure 6:
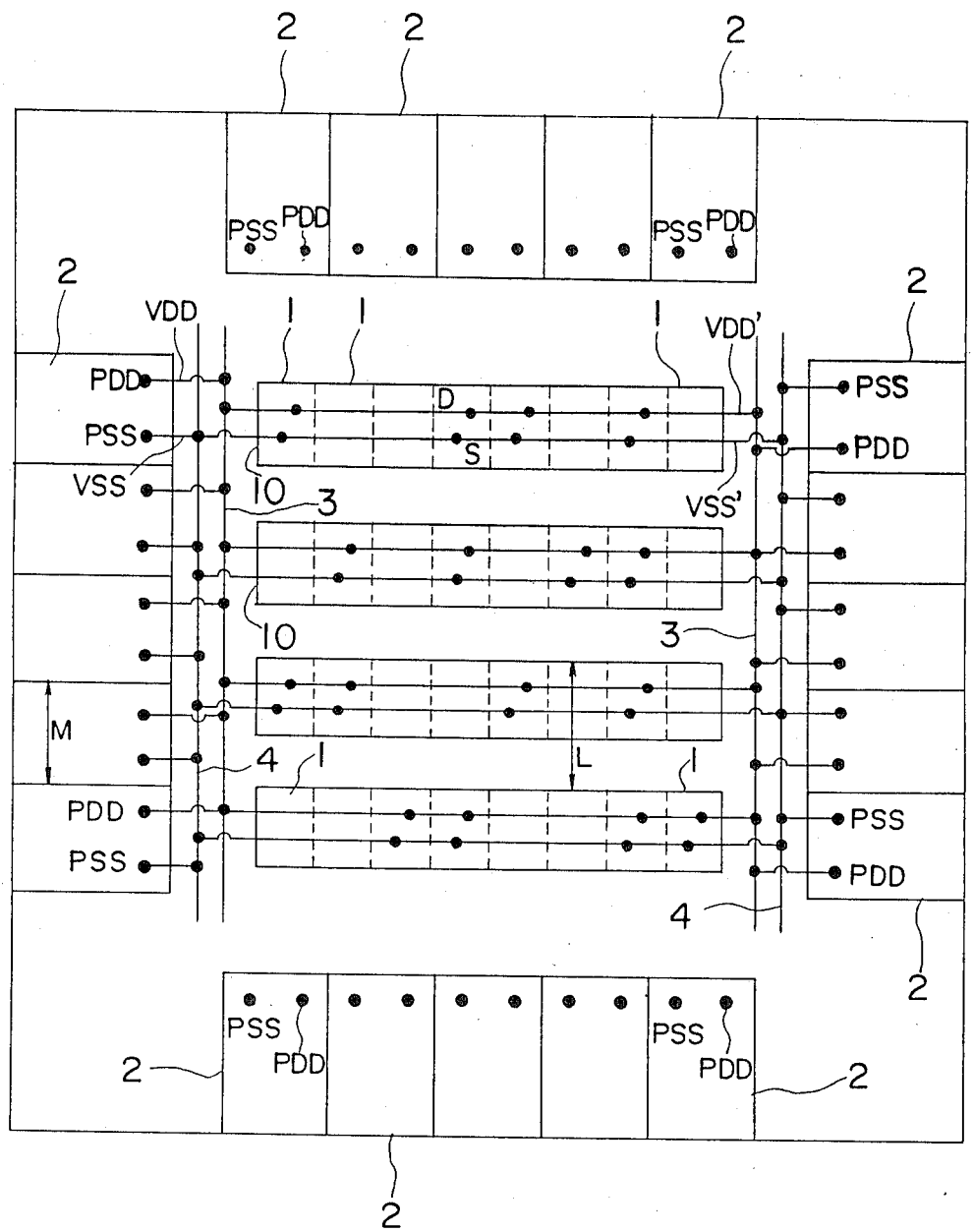
FIG. 6 is a top plan view of a gate array according to a fourth embodiment of the present invention.
Figure 7:
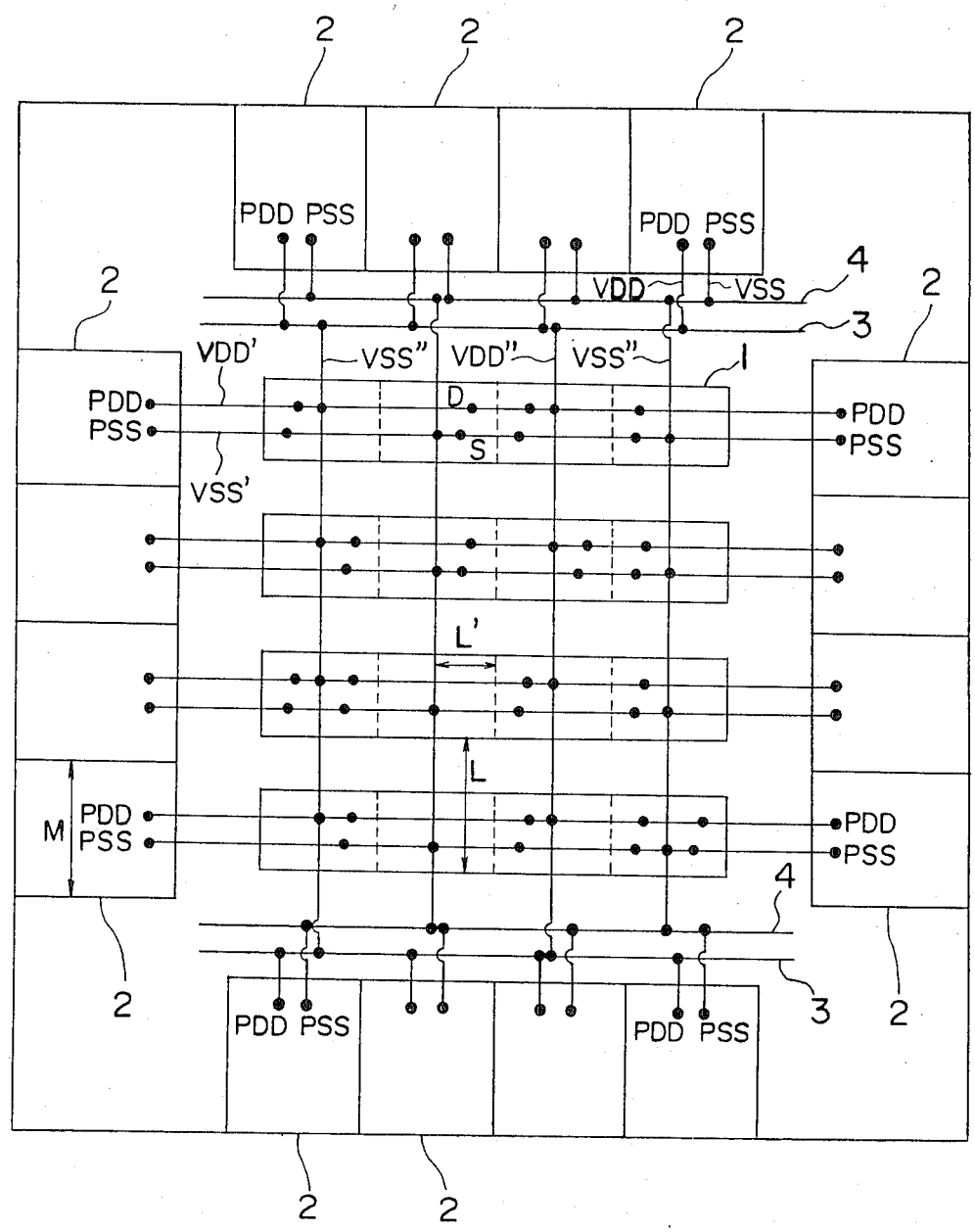
FIG. 7 is a top plan view of a gate array according to a fifth embodiment of the present invention.

According to the present invention, each of bus lines 3 and 4 is not necessarily formed in the closed loop, but can be opened. Furthermore, lines 3 and 4 can be extended only in the vertical direction, such as in the case where the lines crossing the basic cells 1 extend only in horizontal direction, such as shown in FIG. 6. Moreover, lines 3 and 4 can be extended only in the horizontal direction, such as in the case where the lines crossing the basic cells 1 extend only in vertical direction, such as shown in FIG. 7.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A gate array arrangement formed on a semiconductor chip comprising:

a plurality of I/O cells aligned in a rectangular formation with a first predetermined pitch, each I/O cell having a power source output terminal and a ground terminal for outputting voltage by an externally provided wire through an electric power pad, said terminals being located at identical positions in each of said I/O cells;

a plurality of basic cells aligned in a plurality of rows extending in a space defined by said I/O cells, said rows being aligned with a second predetermined pitch;

first and second bus lines formed on a first electrode layer and extending in parallel in a space between said I/O cells and said basic cells;

a first interconnecting power line formed on a separate layer insulated from said first electrode layer and extending between said power source terminal and said first bus line;

a second interconnecting ground line formed on a separate layer insulated from said first electrode layer and extending between said ground terminal and said second bus line, said first and second interconnecting lines supplying power to the first and second bus lines and being aligned side-by-side and parallel to one another;

a third interconnecting power line formed on a separate layer insulated from said first electrode layer and extending straight from said first bus line and crossing said basic cells;

a fourth interconnecting ground line formed on the first electrode layer and extending straight from said second bus line and crossing said basic cells, wherein said third and fourth interconnecting lines are aligned side-by-side and parallel to one another, and said basic cells are supplied from said third and fourth interconnecting lines, and wherein said first and second predetermined pitches are determined independently of one another.

2. A gate array arrangement formed on a rectangular chip having first, second, third, and fourth sides, in which the first and second sides are orthogonal to each other and third and fourth sides are respectively parallel to said first and second sides, said gate array arrangement comprising:

a plurality of I/O cells aligned along four sides of said rectangular semiconductor chip with a first predetermined pitch, each I/O cell having a power source output terminal and a ground terminal for outputting voltage by an externally provided wire through an electric power pad, said terminals being located at identical positions in each of said I/O cells;

a plurality of basic cells aligned in a plurality of rows extending in a space defined by said I/O cells, said rows being parallel to said first side of said chip and aligned with a second predetermined pitch;

first and second bus lines formed on a first electrode layer, and both extending in parallel in a space between said I/O cells and said basic cells in a rectangular formation with four sides thereof being parallel to said four sides of said chip;

a first interconnecting power line formed on a separate layer insulated from said first electrode layer and extending parallel to said first side of said chip and between said power source terminal of I/O cells aligned along said second and fourth sides of said chip and said first bus line;

a second interconnecting ground line formed on a separate layer insulated from said first electrode layer, and extending parallel to said first side and said chip and between said ground terminal of I/O cells aligned along said second and fourth sides of said chip and said second bus line, said first and second interconnecting lines supplying power to the first and second bus lines and being aligned side-by-side and parallel to one another;

a third interconnecting power line formed on a separate layer insulated from said first electrode layer and extending straight from said first bus line parallel to said first side of said chip, said third interconnecting power line crossing said basic cell row longitudinally;

a fourth interconnecting ground line formed on the first electrode layer and extending straight from said second bus line parallel to said first side of said chip, said fourth interconnecting ground line crossing said basic cell row longitudinally, wherein said third and fourth interconnecting lines are aligned side-by-side and parallel to one another, and said basic cells are supplied from said third and fourth interconnecting lines, and wherein said first and second predetermined pitches are determined independently of each other.

3. A gate array arrangement as claimed in claim 2, wherein said first predetermined pitch is greater than said second predetermined pitch.

4. A gate array arrangement as claimed in claim 2, wherein said first predetermined pitch is smaller than said second predetermined pitch.

5. A gate array arrangement formed on a rectangular semiconductor chip having first, second, third and fourth sides, in which the first and second sides are orthogonal to each other and third and fourth sides are respectively parallel to said first and second sides, said gate array arrangement comprising:

a plurality of I/O cells aligned along four sides of said rectangular semiconductor chip with a first predetermined pitch, each I/O cell having a power source terminal and a ground terminal, which terminals are located at identical positions in each of said I/O cells;

a plurality of basic cells aligned in a plurality of rows extending in a space defined by said I/O cells, said rows being parallel to first side of said chip and aligned with a second predetermined pitch;

first and second bus lines, both extending in a direction parallel to said second side of said chip and in a space between said I/O cells aligned along said second side of said chip and one opposite end of said basic cell rows and also in a space between said I/O cells aligned along said fourth side of said chip and an other opposite end of said basic cell rows;

a first interconnecting power line extending parallel to said first side of said chip and between said power source terminal of I/O cells aligned along said second and fourth sides of said chip and first bus line;

a second interconnecting ground line extending parallel to said first side of said chip and between said ground terminal of I/O cells aligned along said second and fourth sides of said chip and said second bus line wherein said first and second interconnecting lines are aligned side-by-side and parallel to one another;

a third interconnecting power line extending straight from said first bus line parallel to said first side of said chip, said third interconnecting power line crossing said basic cell row longitudinally;

a fourth interconnecting ground line extending straight from said second bus line parallel to said first side of said chip, said fourth interconnecting ground line crossing said basic cell row longitudinally, wherein said third and fourth interconnecting lines are aligned side-by-side and parallel one to another, and wherein said first and second predetermined pitches are determined independently of each other.

6. A gate array arrangement as claimed in claim 5, wherein said first predetermined pitch is greater than said second predetermined pitch.

7. A gate array arrangement as claimed in claim 5, wherein said first predetermined pitch is smaller than said second predetermined pitch.

8. A gate array arrangement formed on a rectangular semiconductor chip having first, second, third and fourth sides, in which the first and second sides are orthogonal to each other and third and fourth sides are respectively parallel to said first and second sides, said gate array arrangement comprising:

a plurality of I/O cells aligned along four sides of said rectangular semiconductor chip with a first predetermined pitch, each I/O cell having a power source terminal and a ground terminal, which terminals are located at identical positions in each of said I/O cells;

a plurality of basic cells aligned in a plurality of rows in a direction parallel to said first side with a third predetermined pitch;

first and second bus lines, both extending in a space between said I/O cells and said basic cells in a rectangular formation with four sides thereof being parallel to said four sides of said chip;

a first interconnecting power line extending parallel to said second side of said chip and between said power source terminal of I/O cells aligned along said first and third sides of said chip and said first bus line;

a second interconnecting ground line extending parallel to said second side of said chip and between said ground terminal of I/O cells aligned along said first and third sides of said chip and said second bus line, wherein said first and second interconnecting lines are aligned side-by-side and parallel to one another;

a third interconnecting power line extending straight from said first bus line parallel to said second side of said chip, said third interconnecting power line crossing said basic cell rows;

a fourth interconnecting ground line extending straight from said second bus line parallel to said second side of said chip, said fourth interconnecting ground line crossing said basic cell rows, wherein said third and fourth interconnecting lines are aligned side-by-side and parallel to one another, and wherein said first and third predetermined pitches are determined independently of one another.

9. A gate array arrangement as claimed in claim 8, wherein said third pitch is smaller than said first pitch.

10. A gate array arrangement as claimed in claim 8, wherein said rows are parallel to said first side of said chip and aligned with a second predetermined pitch.

11. A gate array arrangement as claimed in claim 10, further comprising:

a fifth interconnecting power line (VDD) extending parallel to said first side of said chip and between said power source terminal of I/O cells aligned along said second and fourth sides of said chip and said first bus line;

a sixth interconnecting ground line extending parallel to said first side of said chip and between said ground terminal of I/O cells aligned along said second and fourth sides of said chip and said second bus line;

a seventh interconnecting power line extending from said first bus line parallelly to said first side of said chip, said seventh interconnecting power line crossing said basic cell row longitudinally;

a eighth interconnecting ground line extending from said second bus line parallelly to said first side of said chip, said eighth interconnecting ground line crossing said basic cell row longitudinally, whereby said first and second predetermined pitches and are determined independently of each other.

12. A gate array arrangement formed on a rectangular semiconductor chip having first, second, third and fourth sides, in which the first and second sides are orthogonal to each other and third and fourth sides are respectively parallel to said first and second sides, said gate array arrangement comprising:

a plurality of I/O cells aligned along four sides of said rectangular semiconductor chip with a first predetermined pitch, each I/O cell having a power source terminal and a ground terminal, which terminals are located at identical positions in each of said I/O cells;

a plurality of basic cells aligned in a plurality of rows in a direction parallel to said first side with a third predetermined pitch;

first and second bus lines, both extending in a direction parallel to said first side of said chip and in a space between said I/O cells aligned along said third side of said chip and said basic cell rows and also in a space between said I/O cells aligned along said first side of said chip and said basic cell rows;

a first interconnecting power line extending parallel to said second side of said chip and between said power source terminal of I/O cells aligned along said first and third sides of said chip and said first bus line;

a second interconnecting ground line extending parallel to said second side of said chip and between said ground terminal of I/O cells aligned along said first and third sides of said chip and said second bus line, wherein said first and second interconnecting lines are aligned side-by-side and parallel to one another;

a third interconnecting power line extending straight from said first bus line parallel to said second side of said chip, said third interconnecting power line crossing said basic cell rows;

a fourth interconnecting ground line extending straight from said second bus line parallel to said second side of said chip, said fourth interconnecting ground line crossing said basic cell rows, wherein said third and fourth interconnecting lines are aligned side-by-side and parallel to one another and wherein said first and third predetermined pitches are determined independently of one another.

* * * * *